(12) United States Patent
Cosmin et al.

(10) Patent No.: US 7,830,714 B2
(45) Date of Patent: Nov. 9, 2010

(54) NON-VOLATILE MEMORY WITH HIGH RELIABILITY

(75) Inventors: A. Peter Cosmin, San Jose, CA (US); Sorin S. Georgescu, San Jose, CA (US); George Smarandoiu, San Jose, CA (US); Adrian M. Tache, Buccresti (RO)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 192 days.

(21) Appl. No.: 12/106,777

(22) Filed: Apr. 21, 2008

(65) Prior Publication Data
US 2008/0291729 A1 Nov. 27, 2008

Related U.S. Application Data

(60) Provisional application No. 60/940,376, filed on May 25, 2007.

(51) Int. Cl.
*G11C 16/04* (2006.01)
(52) U.S. Cl. .............................. 365/185.17; 365/185.05
(58) Field of Classification Search ............ 365/185.17, 365/185.05, 185.33
See application file for complete search history.

(56) References Cited

U.S. PATENT DOCUMENTS

| | | | |
|---|---|---|---|
| 6,160,739 A | 12/2000 | Wong | |
| 6,232,634 B1 | 5/2001 | Wu et al. | |
| 6,400,604 B2 * | 6/2002 | Noda | 365/185.12 |
| 6,862,223 B1 * | 3/2005 | Lee et al. | 365/185.33 |
| 7,411,826 B2 * | 8/2008 | Ichige et al. | 365/185.17 |
| 2006/0138245 A1 * | 6/2006 | Lee | 235/492 |

* cited by examiner

*Primary Examiner*—Vu A Le
(74) *Attorney, Agent, or Firm*—Bever, Hoffman & Harms, LLP; E. Eric Hoffman

(57) ABSTRACT

A non-volatile memory (NVM) system includes a set of NVM cells, each including: a NVM transistor; an access transistor coupling the NVM transistor to a corresponding bit line; and a source select transistor coupling the NVM transistor to a common source. The NVM cells are written by a two-phase operation that includes an erase phase and a program phase. A common set of bit line voltages are applied to the bit lines during both the erase and programming phases. The access transistors are turned on and the source select transistors are turned off during the erase and programming phases. A first control voltage is applied to the control gates of the NVM transistors during the erase phase, and a second control voltage is applied to the control gates of the NVM transistors during the program phase. Under these conditions, the average required number of Fowler-Nordheim tunneling operations is reduced.

19 Claims, 5 Drawing Sheets

NON-VOLATILE MEMORY WITH HIGH RELIABILITY

RELATED APPLICATION

The present application is related to, and claims priority of, U.S. Provisional Patent Application Ser. No. 60/940,376 filed by A. Peter Cosmin, Sorin S. Georgescu, George Smarandoiu and Adrian M. Tache on May 25, 2007.

FIELD OF THE INVENTION

The present invention relates to a non-volatile memory that exhibits high reliability and endurance in view of repeated write operations.

RELATED ART

FIG. 1 is a circuit diagram that illustrates a portion 10 of a conventional non-volatile memory array, wherein this portion 10 stores an 8-bit byte. Non-volatile memory array portion 10 includes non-volatile memory cells 100-107, bit lines 130-137, byte select transistor 140, word line 150 and common source line 160. Non-volatile memory cells 100-107 include n-channel access transistors 110-117, and n-channel non-volatile memory transistors 120-127. Each of the non-volatile memory transistors 120-127 includes a floating gate for storing charge in a manner well known to those of ordinary skill in the art. As described herein, when the floating gate of a non-volatile memory transistor stores a significant negative charge, the non-volatile memory transistor is said to be in an erased state. Conversely, when the floating gate of a non-volatile memory transistor stores a neutral or positive charge, the non-volatile memory transistor is said to be in a programmed state. A non-volatile memory transistor in the erased state has a higher threshold voltage than a non-volatile memory transistor in the programmed state. It is understood that the conventions for an erased state and programmed state may be reversed in other embodiments.

The drains of access transistors 110-117 are coupled to bit lines 130-137, respectively. The sources of access transistors 110-117 are coupled to the drains of non-volatile memory transistors 120-127, respectively. Word line 150 is coupled to the gates of access transistors 110-117, as well as to the gate of byte select transistor 140. The sources of non-volatile memory transistors 120-127 are connected to common source line 160. The bit line signals on bit lines 130-137 are labeled b0-b7, respectively. A byte select signal BSEL is applied to the source of byte select transistor 140. A word line signal (WL) and a common source signal (CS) are applied to word line 150 and common source line 160, respectively.

An 8-bit data byte is written to non-volatile memory cells 100-107 using a two-phase process, which includes an erase phase followed by a program phase. This two-phase process is described below.

First, all of the non-volatile memory cells 100-107 are initially erased during the erase phase. The erase phase is implemented as follows. The byte select signal BSEL and the word line signal WL are each controlled each have a high voltage (e.g., 15 Volts). All of the bit line signals b0-b7 are controlled to have a low voltage (e.g., 0 Volts). The common source line 160 is left in a floating state. Under these conditions, byte select transistor 140 is turned on, such that the high voltage byte select signal BSEL is applied to the control gates of non-volatile memory transistors 120-127. The high voltage word line signal WL causes access transistors 110-117 to turn on, such that the drains of non-volatile memory transistors 120-127 are pulled down to the low bit line voltage (e.g., 0 Volts). Under these conditions, electrons may be injected into the floating gates of non-volatile memory transistors 120-127 by Fowler-Nordheim tunneling. More specifically, electrons are injected into the floating gates of non-volatile memory transistors 120-127 that were not initially in an erased state at the beginning of the erase phase. The floating gates of non-volatile memory transistors 120-127 were initially in an erased state at the beginning of the erase phase, remain in the erased state (as electrons were previously injected into these floating gates during a previous operation).

At the end of the erase phase, all of the floating gates of non-volatile memory transistors 120-127 are in an erased state, wherein each of these floating gates stores a negative charge, which causes the associated non-volatile memory transistor to exhibit a relatively high threshold voltage. Under these conditions, each of non-volatile memory cells 100-107 is said to store a logic '1' data bit.

After all of the non-volatile memory cells 100-107 have been erased to store logic '1' values, the program phase is implemented. During the program phase, electrons are removed from the floating gates of the non-volatile memory transistors 120-127 that will store a logic '0' value. For example, logic '0' bits would be stored in non-volatile memory transistors 120 and 121 as follows. The word line signal WL and the bit line signals b0 and b1 are each controlled to have a high voltage (e.g., 15 Volts). The byte select signal BSEL and the bit line signals b2-b7 are controlled to have a low voltage (e.g., 0 Volts). The common source line 160 is left in a floating state. Under these conditions, byte select transistor 140 is turned on, such that the low voltage byte select signal BSEL is applied to the control gates of non-volatile memory transistors 120-127. The high voltage word line signal WL causes access transistors 110-117 to turn on, such that the drains of non-volatile memory transistors 120-127 are pulled to the associated bit line voltages. Thus, the drains of non-volatile memory transistors 120 and 121 are pulled up to the high bit line voltage (e.g., 15 Volts), while the drains of non-volatile memory transistors 122-127 are pulled down to the low bit line voltage (e.g., 0 Volts). Under these conditions, electrons are removed from the floating gates of non-volatile memory transistors 120 and 121 by Fowler-Nordheim tunneling. As a result, the threshold voltages of non-volatile memory transistors 120 and 121 are reduced, effectively programming non-volatile memory cells 100 and 101.

Because the control gates and drains of non-volatile memory transistors 122-127 are both held at the same voltage (e.g., 0 Volts), the charge stored on the floating gates of these non-volatile memory transistors 122-127 does not change during the programming phase. As a result, the associated non-volatile memory cells 102-107 remain in the erased state (i.e., store logic '1' data bits).

Fowler-Nordheim tunneling can only be performed a limited number of times before the non-volatile memory transistors 120-127 will fail (i.e., are no longer capable of being programmed or erased.) The endurance of non-volatile memory transistors 120-127 is typically measured by the number of access cycles that can be performed before failure. The above-described method for writing data to non-volatile memory cells 100-107 undesirably requires (on average) a large number of Fowler-Nordheim tunneling operations, thereby resulting in relatively low cell endurance.

Certain applications require that the same data be repeatedly re-written to non-volatile memory array portion 10. For example, a monitoring system may require data to be periodically written to non-volatile memory array 10. Even if the data remains unchanged, each successive write operation will introduce 'wear' to the non-volatile memory cells 100-107 that store logic '0' data values. This wear occurs because writing a logic '0' data value to a non-volatile memory transistor that already stores a logic '0' data value requires a first Fowler-Nordheim tunneling operation during the erase phase of the write operation, and a second Fowler-Nordheim tunneling operation during the program phase of the write operation.

It would therefore be desirable to have a non-volatile memory system capable of repeatedly re-writing the same data values without reducing the endurance of the non-volatile memory system.

As described above, non-volatile memory array portion 10 requires control circuitry to modify the bit line voltages b0-b7 between the erase and program phases of the write operation. This control circuitry must initially provide bit line voltages b0-b7 are all low during the erase phase, and subsequently increase the bit line voltages b0-b7 associated with non-volatile memory cells to be programmed to store a logic '0' data value during the program phase. This control circuitry undesirably adds complexity to the non-volatile memory portion 10. This control circuitry can also increase the required write cycle time of non-volatile memory portion 10.

It would therefore be desirable to have a non-volatile memory system capable of operating in response to the same bit line voltages during the erase and program phases of a write operation.

SUMMARY

Accordingly, the present invention provides a non-volatile memory system that includes a plurality of non-volatile memory cells. Each of these non-volatile memory cells includes a non-volatile memory transistor, an access transistor coupling the non-volatile memory transistor to a corresponding bit line, and a source select transistor coupling the non-volatile memory transistor to a common source. The non-volatile memory cells are written by a two-phase operation that includes an erase phase and a program phase. During both the erase phase and the program phase, the access transistors are turned on, thereby coupling the non-volatile memory transistors to the corresponding bit lines. The source select transistors are turned off during both the erase phase and the program phase, with the common source left floating at this time.

A common set of bit line voltages are applied to the bit lines during both the erase and program phases, such that it is not necessary to switch the bit line voltages between the erase and program phases. An erase voltage is applied to the control gates of the non-volatile memory transistors during the erase phase, and a program voltage, different than the erase voltage, is applied to the control gates of the non-volatile memory transistors during the program phase. During the erase phase, Fowler-Nordheim tunneling may be induced in a first subset of the non-volatile memory transistors. During the program phase, Fowler-Nordheim tunneling may be induced in a second subset of the non-volatile memory transistors, wherein the first and second subsets are mutually exclusive. Fowler-Nordheim tunneling may be inhibited in a third subset of the non-volatile memory transistors during both the erase phase and the program phase, wherein the first, second and third subsets are mutually exclusive, and include all of the non-volatile memory transistors subject to the two-phase operation. This two-phase write operation reduces the average expected number of Fowler-Nordheim tunneling operations by half, thereby extending the expected cell endurance.

The present invention will be more fully understood in view of the following description and drawings.

DETAILED DESCRIPTION

Figure 1:
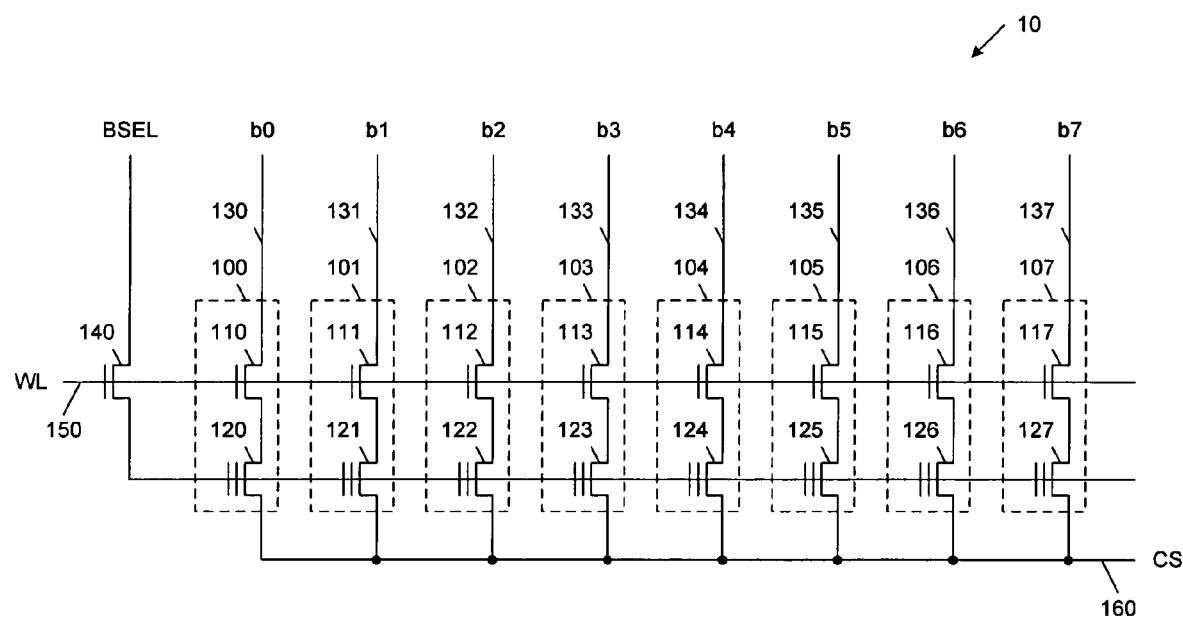
FIG. 1 is a circuit diagram of a portion of a conventional non-volatile memory array.
Figure 2:
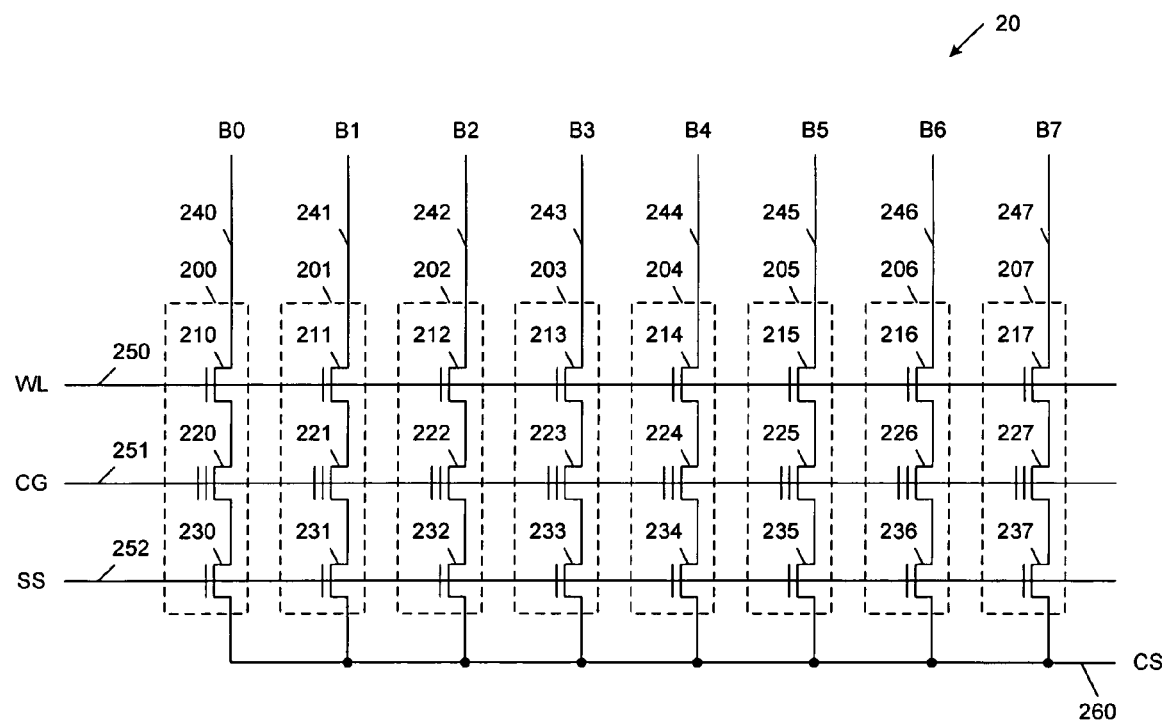
FIG. 2 is a circuit diagram of a portion of non-volatile memory array in accordance with one embodiment of the present invention.

FIG. 2 is a circuit diagram of a portion 20 of a non-volatile memory system, wherein this portion 20 stores an 8-bit byte, in accordance with one embodiment of the present invention. Non-volatile memory portion 20 includes non-volatile memory cells 200-207, bit lines 240-247, word line 250, control gate line 251, source select line 252 and common source line 260. Non-volatile memory cells 200-207 include n-channel access transistors 210-217, n-channel non-volatile memory transistors 220-227, and n-channel source select transistors 230-237. Each of the non-volatile memory transistors 220-227 includes a floating gate for storing charge in a manner well known to those of ordinary skill in the art. It is understood that non-volatile memory portion 20 could be expanded to create an array having additional rows and/or columns, in other embodiments of the present invention.

The drains of access transistors 210-217 are coupled to bit lines 240-247, respectively. The sources of access transistors 210-217 are coupled to the drains of non-volatile memory transistors 220-227, respectively. The sources of non-volatile memory transistors 220-227 are connected to the drains of source select transistors 230-237, respectively. The sources of source select transistors 230-237 are commonly connected to common source line 260. Word line 250 is coupled to the gates of access transistors 210-217; control gate line 251 is coupled to the control gates of non-volatile memory transistors 220-227; and source select line 252 is coupled to the gates of source select transistors 230-237.

An 8-bit data byte can be written to non-volatile memory cells 200-207 using the two-phase process, which is described below. This two-phase write operation includes an erase phase and a program phase. Although the erase operation is described as being performed before the program operation, the program operation may be performed before the erase operation in other embodiments.

During both the erase phase and the program phase of the write operation, a word line voltage (WL) of about 15 Volts is applied to word line 250, and a source select voltage (SS) of about 0 Volts is applied to source select line 252. The common source line 260 is left in a floating state during both the erase and program phases.

Also during both the erase and program phases, bit line voltages B0-B7 representative of the desired data values to be written into non-volatile memory cells 200-207 are applied to bit lines 240-247. More specifically, a high voltage of about 15 Volts is applied to the bit lines associated with non-volatile memory cells that will store a logic '1' data bit. Conversely, a low voltage of about 0 Volts is applied to the bit lines associated with non-volatile memory cells that will store a logic '0' data bit. The bit line voltages advantageously do not change between the erase and program phases of a write operation. As a result, write cycle time is reduced and the required control circuitry is simplified.

The erase phase is differentiated from the program phase by the control gate voltage (CG) applied to control gate line 251. Thus, the erase phase is implemented by applying a high control gate voltage (CG) of about 15 Volts to control gate line 251, while the program phase is implemented by applying a low control gate voltage (CG) of about 0 Volts to control gate line 251.

Figure 3:
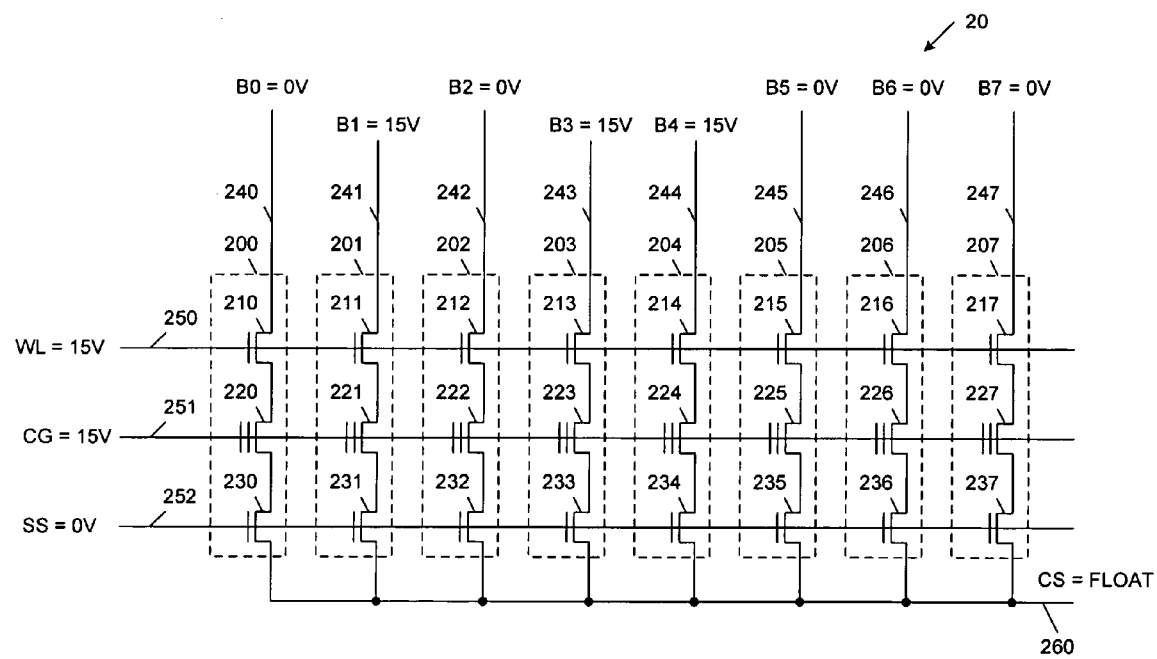
FIG. 3 is a circuit diagram of the non-volatile memory system of FIG. 2, which includes the voltages used to implement an erase phase of a write operation in accordance with one embodiment of the present invention.

FIG. 3 is a circuit diagram that illustrates one example of an erase phase being implemented by non-volatile memory portion 20. In this example, logic '0' data bits will be written to non-volatile memory cells 200, 202 and 205-207, and the state of non-volatile memory cells 201, 203-204 will remain unchanged. Thus, the bit line signals B0, B2, B5, B6 and B7 all have a low voltage of 0 Volts, and the bit line signals B1, B3 and B4 all have a high voltage of 15 Volts.

The high word line voltage (WL=15 Volts) turns on access transistors 210-217, while the low source select voltage (SS=0 Volts) turns off source select transistors 230-237. The turned on access transistors 210-217 cause the voltages B0-B7 on bit lines 240-247 to be applied to the drains of non-volatile memory transistors 220-227, respectively. Thus, in the described example, the drains of non-volatile memory transistors 220, 222, 225, 226 and 227 are coupled to receive the 0 Volt bit line signals B0, B2, B5, B6 and B7, respectively. Similarly, the drains of non-volatile memory transistors 221, 223 and 224 are coupled to receive the 15 Volt bit line signals B1, B4 and B5, respectively.

As described above, the control gates of non-volatile memory transistors 220-227 are coupled to receive a high control gate voltage CG of 15 Volts during the erase phase. Thus, a high voltage (15 Volts-0 Volts) exists across the control gate and the drain of each of the non-volatile memory transistors 220, 222, 225, 226 and 227. This high voltage is sufficient to induce Fowler-Nordheim tunneling of electrons into the floating gates of non-volatile memory transistors 220, 222, 225, 226 and 227 (assuming that these non-volatile memory transistors 220, 222, 225, 226 and 227 were not initially in an erased state at the beginning of the erase phase). Note that the Fowler-Nordheim tunneling mechanism is self-limiting. Thus, the tunneling process will be inhibited after a certain amount of negative charge is stored in the floating gate of a non-volatile memory transistor. Consequently, an already-erased non-volatile memory transistor is not further erased if subsequently subjected to an erase operation. For example, if non-volatile memory transistor 220 is in an erased state prior to the above-described erase phase, the status of this non-volatile memory transistor 220 (including the charge stored by the floating gate of this transistor) would remain substantially the same after the erase phase. Note that Fowler-Nordheim would not occur in non-volatile memory transistor 220 in this example. As a result, the endurance of non-volatile memory cell 220 is not significantly affected by this erase phase.

At the end of the erase phase, all of the floating gates of non-volatile memory transistors 220, 222, 225, 226 and 227 are in an erased state, wherein each of these floating gates stores a negative charge, which causes the associated non-volatile memory transistors 220, 222, 225, 226 and 227 to exhibit relatively high threshold voltages. Under these conditions, each of non-volatile memory cells 220, 222, 225, 226 and 227 is said to store a logic '1' data bit.

As described above, the control gates and the drains of non-volatile memory transistors 221, 223 and 224 are held at the same voltage of about 15 Volts. As a result, there is no significant voltage drop across the control gates and the drains of these non-volatile memory transistors 221, 223 and 224 in the described example. Consequently, non-volatile memory transistors 221, 223 and 224 are not erased during the erase phase. Rather, these non-volatile memory transistors 221, 223 and 224 maintain their original states during the erase phase.

After the erase phase has been completed, the program phase is initiated by reducing the control gate voltage CG to 0 Volts. The other voltages of non-volatile memory portion 20 remain unchanged from the erase phase. Advantageously, the bit line voltages B0-B7 remain unchanged across the erase and program operations.

Figure 4:
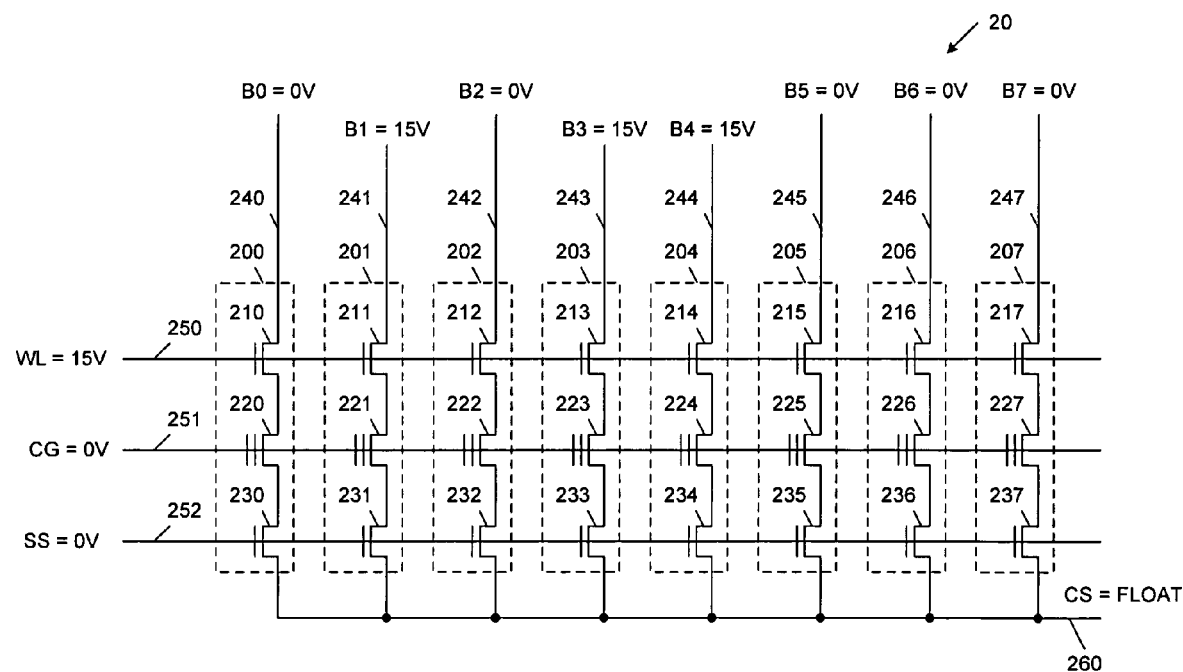
FIG. 4 is a circuit diagram of the non-volatile memory system of FIG. 2, which includes the voltages used to implement a program phase of a write operation in accordance with one embodiment of the present invention.

FIG. 4 is a circuit diagram that illustrates the voltages applied to non-volatile memory portion 20 during the program phase of the write operation of the present example.

Again, the high word line voltage WL (15 Volts) turns on access transistors 210-217, while the low source select voltage SS (0 Volts) turns off source select transistors. The turned on access transistors 210-217 cause the bit line voltages B0-B7 to be applied to the drains of non-volatile memory transistors 220-227, respectively.

Because the control gates of non-volatile memory transistors 220-227 are coupled to receive the low control gate voltage CG of 0 Volts, a relatively high voltage (0 Volts-15 Volts) exists across the control gate and the drain of each of the non-volatile memory transistors 221, 223 and 224. This high voltage is sufficient to induce Fowler-Nordheim tunneling of excess electrons out of the floating gates of the non-volatile memory transistors 221, 223 and 224 (assuming that these non-volatile memory transistors 221, 223 and 224 were not initially in a programmed state at the beginning of the program phase).

Again, because the Fowler-Nordheim tunneling mechanism is self-limiting, the tunneling process will be inhibited after a certain amount of negative charge is removed from the floating gate of a non-volatile memory transistor. Consequently, an already-programmed non-volatile memory transistor is not further programmed if subsequently subjected to a program phase. For example, if non-volatile memory transistor 221 is in a programmed state prior to the above-described program phase, the status of this non-volatile memory transistor 221 (including the charge stored by the floating gate of this transistor) would remain substantially the same after the program phase. Note that Fowler-Nordheim would not occur in non-volatile memory transistor 221 in this example. As a result, the endurance of non-volatile memory cell 221 is not significantly affected by this program phase.

At the end of the program phase, all of the floating gates of non-volatile memory transistors 221, 223 and 224 are in a programmed state, wherein each of these floating gates stores a neutral or positive charge, which causes the associated non-volatile memory transistors 221, 223 and 224 to exhibit relatively low threshold voltages. Under these conditions, each of non-volatile memory cells 221, 223 and 224 is said to store a logic '0' data bit.

As described above, the control gates and the drains of non-volatile memory transistors 220, 222, 225, 226 and 227 are all held at a voltage of about 0 Volts during the program phase. As a result, there is no significant voltage drop across the control gate and the drain of non-volatile memory transistors 220, 222, 225, 226 and 227 during the program phase of the described example. Consequently, non-volatile memory transistors 220, 222, 225, 226 and 227 are not programmed during the program phase. Rather, these non-volatile memory transistors 220, 222, 225, 226 and 227 maintain their original (erased) states during the program phase.

As described above, Fowler-Nordheim tunneling only occurs within a non-volatile memory cell of the present invention if the data value being written to the memory cell is different than the data value stored in the memory cell. Thus, no Fowler-Nordheim tunneling is performed within any of the non-volatile memory cells 200-207 if the 8-bit byte being written to these memory cells 200-207 is identical to the 8-bit byte already stored in these memory cells 200-207. Consequently, unlimited cycling is enabled within non-volatile memory portion 20 when re-writing the same data.

Moreover, the average endurance of non-volatile memory cells 200-207 is increased two-fold with respect to the conventional non-volatile memory cells 100-107, assuming that the data written to these memory cells varies in a random manner. That is, twice as many Fowler-Nordheim tunneling operations are required, on average, when performing random write operations to conventional non-volatile memory cells 100-107. This can be shown as follows. There are four possible write operations to a non-volatile memory cell: (1) write a logic '0' value to a non-volatile memory cell when a logic '0' value is already stored in the non-volatile memory cell; (2) write a logic '1' value to a non-volatile memory cell when a logic '0' value is already stored in the non-volatile memory cell; (3) write a logic '0' value to a non-volatile memory cell when a logic '1' value is already stored in the non-volatile memory cell; and (4) write a logic '1' value to a non-volatile memory cell when a logic '1' value is already stored in the non-volatile memory cell.

When performing write operations to conventional non-volatile memory cell 100, two Fowler-Nordheim tunneling operations are required for write operation (1), one Fowler-Nordheim tunneling operation is required for write operation (2), and one Fowler-Nordheim tunneling operation is required for write operation (3). On average, one Fowler-Nordheim tunneling operation is required per write operation (i.e., 4 Fowler-Nordheim tunneling operations/4 write operations).

In contrast, when performing write operations to non-volatile memory cell 200, one Fowler-Nordheim tunneling operation is required for write operation (2) and one Fowler-Nordheim tunneling operation is required for write operation (3). On average, only one-half Fowler-Nordheim tunneling operation is required per write operation (i.e., 2 Fowler-Nordheim tunneling operations/4 write operations).

Figure 5:
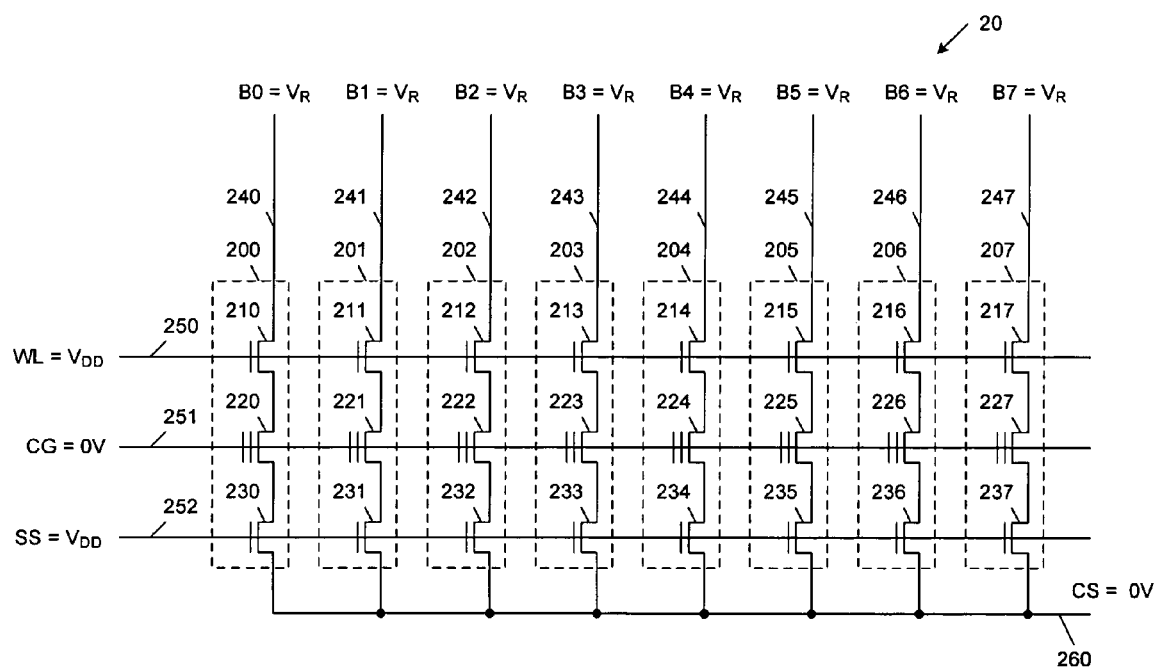
FIG. 5 is a circuit diagram of the non-volatile memory system of FIG. 2, which includes the voltages used to implement a read operation in accordance with one embodiment of the present invention.

FIG. 5 is a circuit diagram that illustrates the voltages applied to non-volatile memory system 20 during a read operation. The gates of access transistors 210-217 and the gates of source select transistors 230-237 are coupled to receive a voltage equal to the $V_{DD}$ supply voltage of about 1.8 to 5 Volts (i.e., WL=SS=$V_{DD}$). The control gates of non-volatile memory transistors 220-227 are coupled to receive a low control gate voltage CG of 0 Volts. The common source line 260 is also configured to receive a low common source voltage CS of 0 Volts. A read voltage $V_R$ of about 1 Volt is applied to bit lines 240-247. Under these conditions, current sensing circuits (not shown) coupled to bit lines 240-247 sense the currents flowing through non-volatile memory cells 200-207 to identify the data values stored in these cells. In the described examples, non-volatile memory cells in the programmed state will exhibit a higher read current flow than non-volatile memory cells in the erased state. Note that in one embodiment, the control gate voltage CG can have a value anywhere between 0 Volts and the $V_{DD}$ supply voltage during a read operation, depending on cell doping and other design variables.

Although the present invention has been described in connection with specific embodiments and examples, it is understood that the present invention can be applied to different embodiments and examples. For example, although the present invention has been described in connection with a byte level write operation, it is understood that the concepts of the present invention can be applied to data entities having other widths. For example, the present invention can be modified to implement page level write operations. Thus, the invention is limited only by the following claims.

We claim:

1. A non-volatile memory system comprising:
   a set of bit lines;
   a set of non-volatile memory cells, each coupled to a common source and each including:
   a non-volatile memory transistor having a control gate;
   an access transistor having a gate, wherein the access transistor is connected between the non-volatile memory transistor and a corresponding one of the bit lines; and
   a source select transistor having a gate, wherein the source select transistor is connected between the non-volatile memory transistor and the common source;
   a word line coupled to the gate of each access transistor in the set of non-volatile memory cells;
   a control gate line coupled to the control gate of each non-volatile memory transistor in the set of non-volatile memory cells;
   a source select line coupled to the gate of each source select transistor in the set of non-volatile memory cells; and
   means for performing a two-phase write operation to the set of non-volatile memory cells, wherein the two-phase write operation includes an erase phase and a program phase, wherein the means for performing the two-phase write operation comprise means for applying a first bit line voltage to a first subset of the set of bit lines during both the erase phase and the program phase, and means for applying a second bit line voltage, different than the first bit line voltage, to a second subset of the set of bit lines during both the erase phase and the program phase.

2. The non-volatile memory system of claim 1, wherein the means for performing the two-phase write operation further comprise means for applying a first control voltage to the control gate line during the erase phase, and a second control voltage to the control gate line during the program phase, wherein the first control voltage is different than the second control voltage.

3. The non-volatile memory system of claim 2, wherein the means for performing the two-phase write operation further comprise means for applying a common word line voltage to the word line during both the erase phase and the program phase.

4. The non-volatile memory system of claim 3, wherein the means for performing the two-phase write operation further comprise means for applying a common source select voltage to the source select line during both the erase phase and the program phase.

5. A non-volatile memory system comprising:
   a set of bit lines;
   a set of non-volatile memory cells, each coupled to a common source and each including:
   a non-volatile memory transistor having a control gate;

an access transistor having a gate, wherein the access transistor is connected between the non-volatile memory transistor and a corresponding one of the bit lines; and a source select transistor having a gate, wherein the source select transistor is connected between the non-volatile memory transistor and the common source;

a word line coupled to the gate of each access transistor in the set of non-volatile memory cells;

a control gate line coupled to the control gate of each non-volatile memory transistor in the set of non-volatile memory cells; and a source select line coupled to the gate of each source select transistor in the set of non-volatile memory cells; and means for performing a two-phase write operation to the set of non-volatile memory cells, wherein the two-phase write operation includes an erase phase and a program phase, wherein the means for performing the two-phase write operation comprises means for inducing Fowler-Nordheim tunneling in a first subset of the set of non-volatile memory cells during the erase phase, and means for inducing Fowler-Nordheim tunneling in a second subset of the set of non-volatile memory cells during the corresponding program phase, wherein the first and second subsets are mutually exclusive.

6. The non-volatile memory system of claim 5, wherein the means for performing the two-phase write operation inhibit Fowler-Nordheim tunneling in a third subset of the set of non-volatile memory cells during both the erase phase and the corresponding program phase.

7. The non-volatile memory system of claim 6, wherein the first, second and third subsets are mutually exclusive and include all of non-volatile memory cells in the set of non-volatile memory cells.

8. The non-volatile memory system of claim 1, wherein each access transistor, non-volatile memory transistor and source select transistor is an n-channel device.

9. The non-volatile memory system of claim 1, wherein the means for performing the two-phase write operation further comprises means for applying a word line voltage to the word line, wherein the word line voltage is the same during both the erase phase and the program phase.

10. The non-volatile memory system of claim 9, wherein the means for performing the two-phase write operation further comprises means for applying a source select voltage to the source select line, wherein the source select voltage is the same during both the erase phase and the program phase.

11. The non-volatile memory system of claim 1, wherein a data bit having a first logic state is written to each non-volatile memory cell coupled to the first subset of the set of bit lines, and a data bit having a second logic state is written to each non-volatile memory cell coupled the second subset of the set of bit lines.

12. A non-volatile memory system comprising:
a plurality of bit lines;
a plurality of non-volatile memory cells, each coupled to a corresponding one of the plurality of bit lines and a common source, and each including a non-volatile memory transistor, an access transistor coupling the non-volatile memory transistor to the corresponding one of the plurality of bit lines, and a source select transistor coupling the non-volatile memory transistor to the common source; and
means for performing a two-phase write operation to the plurality of non-volatile memory cells, wherein the two-phase write operation includes an erase phase and a program phase, wherein the means for performing the two-phase write operation applies a first bit line voltage to a first subset of the plurality of bit lines during both the erase phase and the program phase, and applies a second bit line voltage, different than the first bit line voltage, to a second subset of the plurality of bit lines during both the erase phase and the program phase.

13. The non-volatile memory system of claim 12, wherein the means for performing the two-phase write operation further applies a word line voltage to the access transistor in each of the plurality of non-volatile memory cells, wherein the word line voltage is the same during both the erase phase and the program phase.

14. The non-volatile memory system of claim 13, wherein the means for performing the two-phase write operation further applies a source select voltage to the source select transistor in each of the plurality of non-volatile memory cells, wherein the source select voltage is the same during both the erase phase and the program phase.

15. The non-volatile memory system of claim 14, wherein the means for performing the two-phase write operation further applies a first control voltage to the non-volatile memory transistor in each of the plurality of non-volatile memory cells during the erase phase, and a second control voltage to the non-volatile memory transistor in each of the plurality of non-volatile memory cells during the program phase, wherein the first control voltage is different than the second control voltage.

16. The non-volatile memory system of claim 12, wherein a data bit having a first logic state is written to each non-volatile memory cell coupled to the first subset of the plurality of bit lines, and a data bit having a second logic state is written to each non-volatile memory cell coupled the second subset of the plurality of bit lines.

17. A non-volatile memory system comprising:
a plurality of bit lines;
a plurality of non-volatile memory cells, each coupled to a corresponding one of the plurality of bit lines and a common source, and each including a non-volatile memory transistor, an access transistor coupling the non-volatile memory transistor to the corresponding one of the plurality of bit lines, and a source select transistor coupling the non-volatile memory transistor to the common source; and
means for performing a two-phase write operation to the set of non-volatile memory cells, wherein the two-phase write operation includes an erase phase and a program phase, wherein the means for performing the two-phase write operation induce Fowler-Nordheim tunneling in a first subset of the plurality of non-volatile memory cells during the erase phase, and induce Fowler-Nordheim tunneling in a second subset of the plurality of non-volatile memory cells during the corresponding program phase, wherein the first and second subsets are mutually exclusive.

18. The non-volatile memory system of claim 17, wherein the means for performing the two-phase write operation inhibit Fowler-Nordheim tunneling in a third subset of the plurality of non-volatile memory cells during both the erase phase and the corresponding program phase.

19. The non-volatile memory system of claim 18, wherein the first, second and third subsets are mutually exclusive and include all of non-volatile memory cells in the plurality of non-volatile memory cells.

* * * * *

UNITED STATES PATENT AND TRADEMARK OFFICE
CERTIFICATE OF CORRECTION

| | | |
|---|---|---|
| PATENT NO. | : 7,830,714 B2 | Page 1 of 1 |
| APPLICATION NO. | : 12/106777 | |
| DATED | : November 9, 2010 | |
| INVENTOR(S) | : A. Peter Cosmin et al. | |

It is certified that error appears in the above-identified patent and that said Letters Patent is hereby corrected as shown below:

Column 9
Line 53, insert -- to -- after "coupled".

Column 10
Line 34, insert -- to -- after "coupled".
Line 47, replace "set" with -- plurality --.
Line 64, delete "of" (first occurrence).

Signed and Sealed this
Fourteenth Day of February, 2012

David J. Kappos
*Director of the United States Patent and Trademark Office*